United States Patent
Etou

(10) Patent No.: US 7,310,017 B2
(45) Date of Patent: Dec. 18, 2007

(54) OPERATIONAL AMPLIFIER CIRCUIT

(75) Inventor: Toshiyuki Etou, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 124 days.

(21) Appl. No.: 11/348,461

(22) Filed: Feb. 7, 2006

(65) Prior Publication Data

US 2006/0176115 A1    Aug. 10, 2006

(30) Foreign Application Priority Data

Feb. 10, 2005   (JP) .............................. 2005-034982

(51) Int. Cl.
*H03F 3/45* (2006.01)
(52) U.S. Cl. ...................................... 330/253; 330/261
(58) Field of Classification Search ......... 330/252–261
See application file for complete search history.

(56) References Cited

U.S. PATENT DOCUMENTS

| | | | | |
|---|---|---|---|---|
| 5,057,788 | A * | 10/1991 | Ushida et al. .............. | 330/261 |
| 5,461,342 | A * | 10/1995 | Crabtree ..................... | 330/252 |
| 7,138,866 | B2 * | 11/2006 | Etoh ........................... | 330/253 |
| 2006/0250185 | A1 * | 11/2006 | Sanduleanu et al. ........ | 330/253 |

FOREIGN PATENT DOCUMENTS

JP    2000-151305    5/2000

OTHER PUBLICATIONS

Waltari, Mikko, et al., "A 220-MSample/s (MOS Sample-and-Hold Circuit Using Double Sampling", Analog Integrated Circuits and Signal Processing, vol. 18, pp. 21-31 (1999).
Cho, Thomas B., et al., "A 10 b, 20 Msample/s, 35 mW Pipeline A/D Converter", IEEE Journal of Solid-State Circuits, vol. 30, No. 3, Mar. 1995, pp. 166-172.

* cited by examiner

*Primary Examiner*—Robert Pascal
*Assistant Examiner*—Hieu Nguyen
(74) *Attorney, Agent, or Firm*—McGinn IP Law Group, PLLC

(57) ABSTRACT

To provide a differential operational amplifier circuit that attains a wide-band and high-DC-gain characteristic and operates with a low power supply voltage. A signal path having three amplifier circuits passing an Nch transistor pair, cascode connected Nch transistor pairs, and a Pch transistor pair functions as a gain path having a high-gain and narrow-band characteristic. In addition, a signal path having two amplifier circuits passing an Nch transistor pair and another Nch transistor pair functions as a feedforward path having a low-gain and wide-band characteristic. Signals amplified through each path are synthesized at an output terminal, whereby a high-gain and wide-band operational amplifier is attained. Further, a constant current source transistor pair supplies a constant current to four drain load resistors of a first differential amplifying pair to drive a circuit with a constant current, thereby reducing a power supply voltage.

11 Claims, 2 Drawing Sheets

OPERATIONAL AMPLIFIER CIRCUIT

BACKGROUND OF THE INVENTION

1. Field of the Invention

The present invention relates to a differential operational amplifier circuit, and more particularly to a high-gain and wide-band operational amplifier circuit.

2. Description of Related Art

As an example of differential operational amplifier circuits, an operational amplifier circuit composed of an input circuit including a differential transistor pair and an output circuit including a cascode circuit is described in "Analog Integrated Circuits and Signal Processing, vol. 18, pp. 21-31 (1999)" and "IEEE Journal of Solid-State Circuits, Vol. 30, No. 3, March 1995, pp. 166-172". FIG. 2 is a circuit diagram showing the example of the operational amplifier circuit described in the above document. The operational amplifier circuit of FIG. 2 is composed of a wide-band differential input circuit including Nch transistors M1 to M4 and a differential output circuit including a cascode circuit of Nch transistors M5 to M8.

Gate electrodes of the Nch transistors M3 and M4 are connected with a common-mode feedback circuit (not shown) for setting a common-mode output voltage of the operational amplifier circuit. A simulation result of the operational amplifier circuit of FIG. 2 shows that a DC gain is 62 dB and a unity gain frequency is 450 MHz (no description about a load capacitance) provided that a semiconductor process with the minimum pitch of 0.5 μm is used, and a power supply voltage is 3 V.

The lowest operation voltage of an input circuit part of the operational amplifier circuit of FIG. 2 is determined based on the sum of a gate-source voltage VGS (for example, 0.6 V) of the Nch transistors M3 (or M4) and M5 (or M6) and a bias voltage necessary for the common-mode feedback circuit to drive a gate of the transistor M3 (or M4) (for example, saturation voltage of transistor, 0.25 V). This voltage is about 1.45 V (0.6 V×2+0.25 V) without consideration of variations. In contrast, the lowest operation voltage of an output circuit part is determined based on the sum of a saturation voltage (0.25 V) of each of the transistors M5, M7, M9, and M11 (or M6, M8, M10, and M12) and an output signal amplitude (for example, $0.5 V_{0-p}$). This voltage is about 1.5 V (0.25 V×4+0.5V) without consideration of variations.

In summary, the lowest operation voltage of the operational amplifier circuit of FIG. 2 is about 1.5 V as the lowest operation voltage of the output circuit part. A requisite nominal value of the lowest operation voltage is about 1.8 V in consideration of temperature characteristics or variations. Incidentally, as the transistors M3 and M4, non-doped Nch transistors that can set the gate-source voltage VGS to about 0.1 V can be used. In this case, the lowest operation voltage of the input circuit part can be lowered. However, a gate-source capacitance of the non-doped Nch transistor is very large and thus functions as a load of the input circuit part, leading to considerable deterioration of band characteristics of the operational amplifier circuit.

In the operational amplifier circuit of FIG. 2, a secondary pole is shifted to a low frequency side for obtaining a high DC gain in the input circuit part. If the secondary pole is shifted to the lower frequency side, there arises a problem that an operation of the operational amplifier circuit becomes unstable. Accordingly, in the operational amplifier circuit of FIG. 2, the DC gain needs to be increased only by the output circuit part for obtaining a high DC gain. As a result, the operational amplifier circuit of FIG. 2 has a drawback that the DC gain cannot be increased. If a gain boosting circuit is additionally provided, the output circuit part can improve the DC gain. However, this results in an increase in element area and power consumption.

Further, Japanese Unexamined Patent Application Publication No. 2000-151305 discloses a full differential operational amplifier circuit of a parallel path structure having a path of one amplifier stage and a path of two amplifier stages and synthesizing signals of the two paths at an output terminal. This full differential operational amplifier circuit enables high-gain and wide-band characteristics as well as operates at low power supply voltage.

The full differential operational amplifier circuit disclosed in Japanese Unexamined Patent Application Publication No. 2000-151305 enables a high gain by adding gains of the two signal amplifying paths. In this full differential operational amplifier circuit, one signal path is a two-stage amplifying path where an output of a first differential amplifier pair composed of Nch transistors is supplied to a gate electrode of a source-grounded Nch transistor after passing through a source to a drain of a gate-grounded Pch transistor, and a drain electrode of the Nch transistor is used as an output terminal. Further, the other signal path is a one-stage amplifying path where an output of a second differential amplifier pair composed of Nch transistors is connected with the output terminal after passing through a source to a drain of the gate-grounded Pch transistor. That is, a load of the Pch transistor and the gate-grounded Pch transistor exist in both of the two signal paths.

In general, a Pch transistor is inferior to an Nch transistor in frequency characteristics. Hence, the insertion of the Pch transistor to the signal amplifying path is undesirable in terms of wide-band characteristics.

To overcome such a problem, the applicants of the present invention discloses, in Japanese Patent No. 2004-015648 (hereinafter, referred to as "prior application"), an operational amplifier circuit of a parallel path structure including first and second differential transistor pairs where a resistor having one terminal applied with an intermediate potential through a source follower composed of a non-doped Nch transistor is set as a drain load with the first differential transistor pair set as an input circuit for a signal path of a gain path designed to have narrow-band and high-gain characteristics for increasing a DC gain and the second differential transistor pair set as an input circuit for a signal path of a feedforward path designed to have wide-band and low-gain characteristics for feedforward of the gain path to synthesize signals amplified via the paths at an output terminal.

According to the prior application, the lowest operation voltage can be set to 1.2 V without consideration of variations, and a nominal value of the lowest operation voltage can be set to about 1.5 V in consideration of variations. Further, if the gain path of the narrow-band and high-gain characteristics is parallel-connected with the forward path of the wide-band and low-gain characteristics, the characteristics of both the paths complement each other to thereby realize an operational amplifier circuit of high-gain and wide-band characteristics with a low power supply voltage.

According to the prior application, as operation voltages for the first differential amplifier circuit and the second differential amplifier circuit, intermediate potentials applied through the source follower circuit composed of the non-doped Nch transistor are used. Thus, a problem about reduction in power supply voltage down to about 1.5 V and a problem about reduction in frequency band for amplified differential signal components are solved. However, a channel width of the non-doped Nch transistor for generating a bias voltage needs to increase for operating the transistor at a power supply voltage lower than 1.5 V. Thus, there arises a problem that an area of the non-doped Nch transistor in a semiconductor chip increases, which hinders size reduction of the semiconductor chip.

SUMMARY OF THE INVENTION

An operational amplifier circuit according to an aspect of the present invention includes: a first differential transistor pair including first and second resistors that have a common source electrode connected with a first constant current source transistor, and a common node connected with a second constant current source transistor and serve as drain loads; and a second differential transistor pair including third and fourth resistors that have a common source electrode connected with a third constant current source transistor, and a common node connected with a fourth constant current source transistor and serve as drain loads, wherein the first differential transistor pair constitutes a signal input circuit of a gain path, and the second differential transistor pair constitutes a signal input circuit of a feedforward path for feedforward of the gain path to obtain a parallel path structure in which signals amplified through each of the paths are synthesized at an output end.

Incidentally, a source constant current source transistor of the second differential transistor pair composing a signal input circuit of a feedforward path is connected on the power supply potential side of the second differential transistor pair, so a Pch transistor is used therefor. However, a drain electrode of the Pch transistor of the constant current source is connected with a power supply side common node connected with a differential transistor pair, so differential signal components amplified with the differential transistor pair cancel out each other at the power supply side common node of the load resistor, and the signal components are not input to the Pch transistor of the constant current source Pch transistor. Therefore, frequency characteristics of the Pch transistor by no means influence band characteristics of a differential signal amplified with the differential transistor pair.

Further, an operational amplifier circuit according to another aspect of the present invention includes: a first differential amplifier circuit composed of first and second Nch transistors (M1, M4) having gate electrodes connected with each differential input terminal, a source electrode commonly connected with a first constant current source Nch transistor (M23), and drain electrodes connected with first and second load resistors (R1, R4), and a first constant current source Pch transistor (M26) having a source electrode connected with a power supply potential (VDD), and a drain electrode connected with a common node between the first and second load resistors (R1, R4); a second differential amplifier circuit composed of third and fourth Nch transistors (M2, M3) having gate electrodes connected with each of the differential input terminals together with gate electrodes of the first and second Nch transistors (M1, M4), a source electrode commonly connected with a second constant current source Nch transistor (M24), and drain electrodes connected with third and fourth load resistors (R3, R2), and a second constant current source Pch transistor (M27) having a source electrode connected with a power supply potential (VDD), and a drain electrode connected with a common node between the third and fourth load resistors (R3, R2); a first cascode amplifier circuit composed of a first cascode amplifier circuit including a fifth Nch transistor (M5) having a source electrode connected with a reference potential (GND), and gate electrode connected with a drain electrode of the first Nch transistor (M1), and a sixth Nch transistor (M7) having a source electrode connected with a drain electrode of the fifth Nch transistor (M5); a second cascode amplifier circuit including a seventh Nch transistor (M6) having a source electrode connected with a reference potential (GND), and a gate electrode connected with a drain electrode of the second Nch transistor (M4), and an eighth Nch transistor (M8) having a source electrode connected with a drain electrode of the seventh Nch transistor (M6); a first output amplifier circuit including a first Pch transistor (M11) having a source electrode connected with a power supply potential (VDD), a gate electrode connected with a drain electrode of the sixth Nch transistor (M7), and a drain electrode connected with one differential output terminal; a second output amplifier circuit including a second Pch transistor (M12) having a source electrode connected with a power supply potential (VDD), a gate electrode connected with a drain electrode of the eighth Nch transistor (M8), and a drain electrode connected with the other differential output terminal; a third output amplifier circuit including a ninth Nch transistor (M13) having a source electrode connected with a reference potential (GND), a gate electrode connected with a drain electrode of the fourth Nch transistor (M3), and a drain electrode connected with the one differential output terminal; and a fourth output amplifier circuit including a tenth Nch transistor (M14) having a source electrode connected with a reference potential (GND), a gate electrode connected with a drain electrode of the third Nch transistor (M2), and a drain electrode connected with the other differential output terminal.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
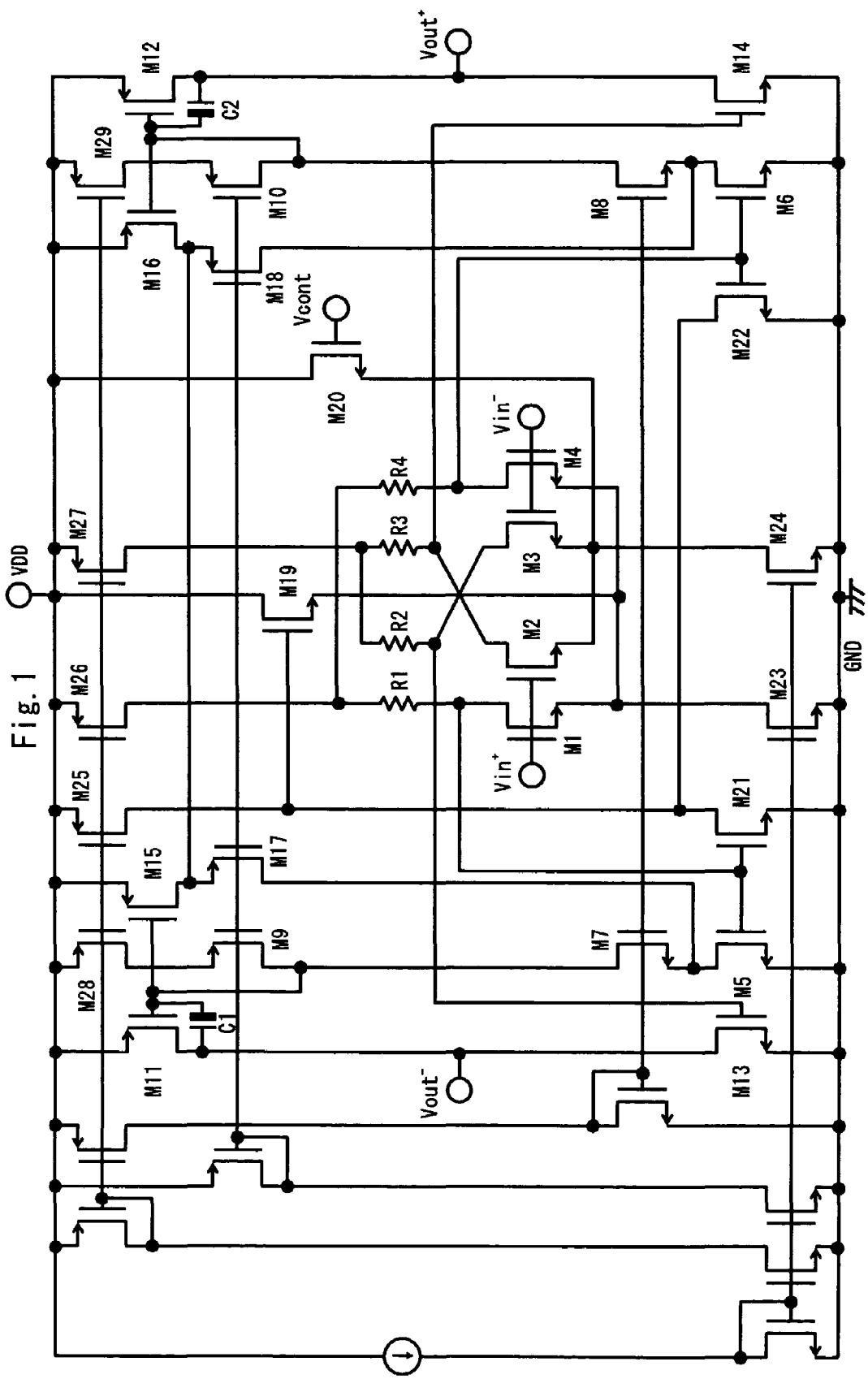
FIG. 1 is a circuit diagram showing an embodiment of the present invention.
Figure 2:
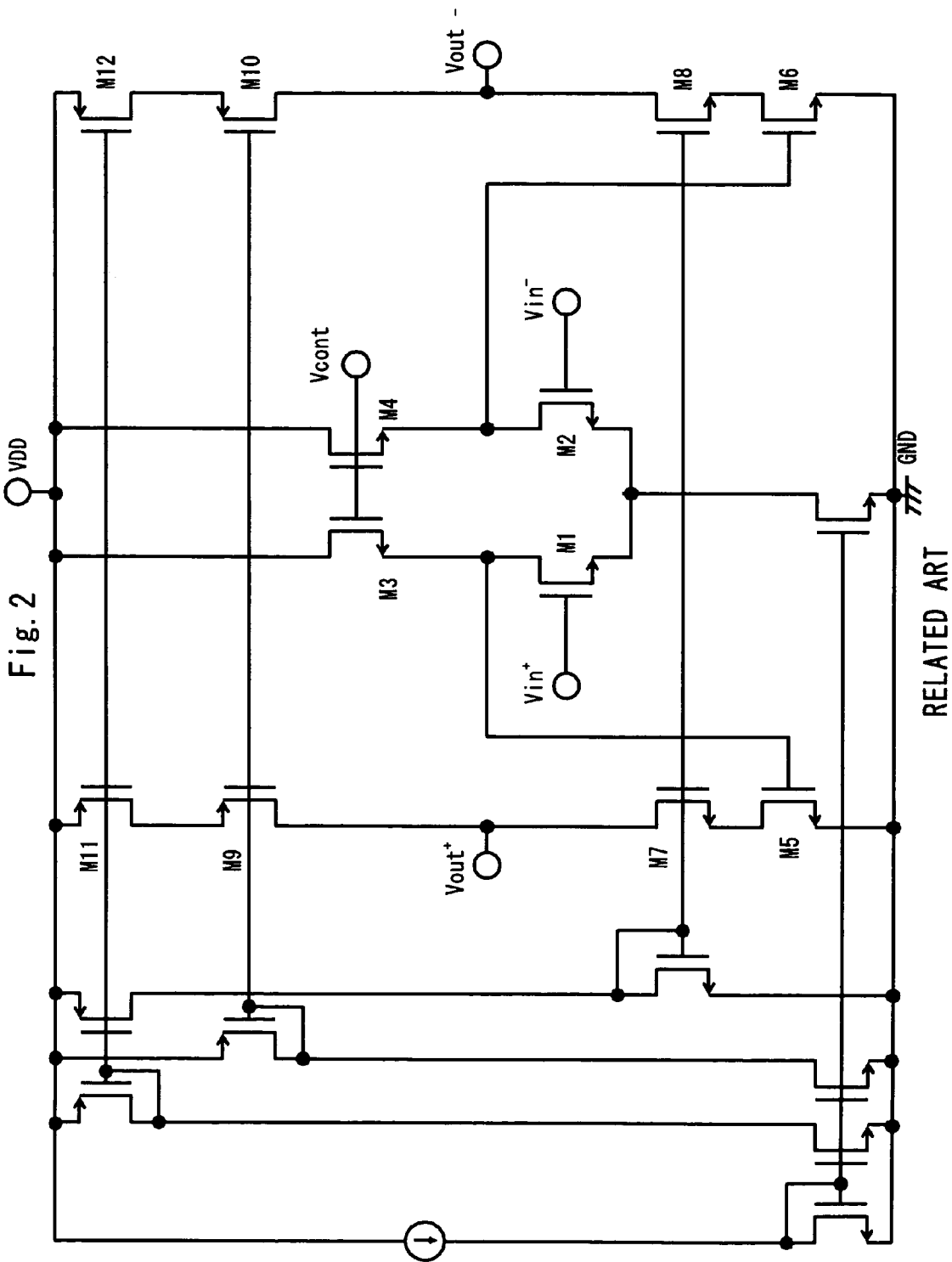
FIG. 2 is a circuit diagram showing the related art.

FIG. 1 is a circuit diagram showing an operational amplifier circuit according to an embodiment of the present invention. As shown in FIG. 1, first and second Nch transistors (for example, Nch transistors M1 and M4) make a first differential transistor pair. Gate electrodes of the first differential transistor pair are applied with differential input signals Vin+ and Vin−, respectively. Source electrodes thereof are commonly connected with a drain electrode of a first constant current source Nch transistor (for example, constant current source transistor M23). Drain electrodes thereof are connected with one terminals of first and second load resistors (for example, load resistors R1 and R4), respectively. Third and fourth Nch transistors (for example, Nch transistors M2 and M3) constitute a second differential transistor pair. Gate electrodes of the second differential transistor pair are applied with differential input signals Vin+ and Vin−, respectively. Source electrodes thereof are commonly connected with a drain electrode of a second constant current source Nch transistor (for example, constant current source transistor M24). Drain electrodes thereof are connected with one terminals of load resistors R3 and R2, respectively.

The other terminals (power supply side) of the load resistors R1 and R4 are connected. A node therebetween is connected with a drain electrode of a first constant current source Pch transistor (for example, Pch constant current source transistor M26) with a source electrode being set to a power supply potential VDD. Likewise, the other terminals (power supply side) of the third and fourth load resistors (for example, load resistors R3 and R2) are connected. A node therebetween is connected with a drain electrode of a second constant current source Pch transistor (for example, Pch constant current source transistor M27) with a source electrode being set to a power supply potential VDD.

The first differential transistor pair (M1, M4) and the second differential transistor pair (M2, M3) are connected with Nch constant current source transistors M23 and M24 with source electrodes being commonly connected. Further, Pch constant current source transistors M26 and M27 are connected with each other through the load resistors R1 and R4 and the load resistors R3 and R2. That is, the first differential transistor pair (M1, M4) and the second differential transistor pair (M2, M3) are supplied with current from each constant current source transistor. Hence, the first differential transistor pair (M1, M4) and the second differential transistor pair (M2, M3) operate as a first differential amplifier circuit and a second differential amplifier circuit that are driven with a constant current.

The first and second differential amplifier circuits constitute an input stage of an operational amplifier of this embodiment. The first and second differential amplifier circuits adopt resistive loads for lowering a requisite power supply voltage of the input stage and obtaining wide-band characteristics. Hence, resistance values of the resistors R1 to R4 are minimized to reduce a DC potential drop due to the resistors R1 to R4 down to about 0.1 V, for example. Thus, the first and second differential amplifier circuits have wide-band characteristics, but their gain is set low.

An output of the drain electrode of the Nch transistor M1 as a component of the first differential amplifier circuit is applied to a gate electrode of a fifth Nch transistor (for example, Nch transistors M5) having a source electrode connected with a reference potential GND. The Nch transistor M5 is cascode connected with a sixth Nch transistor (for example, Nch transistor M7). A first cascode amplifier circuit composed of the cascode connected Nch transistors M5 and M7 and the load Pch transistors M9 and M28 amplifies an output from the drain electrode of the Nch transistors M1. An output of the first cascode amplifier circuit is applied to a gate electrode of a first Pch transistor (for example, Pch transistor M11) having a source electrode connected with the power supply potential VDD. The Pch transistor M11 further amplifies an output of the cascode amplifier circuit and outputs the amplified signal as one differential output signal, Vout−, from the drain electrode of the Pch transistor M11. That is, the Pch transistor M11 serves as a first output amplifier circuit.

Similarly, an output of the drain electrode of the Nch transistor M4 as a component of the first differential amplifier circuit is applied to a gate electrode of a seventh Nch transistor (for example, Nch transistor M6) having a source electrode connected with a reference potential GND. The Nch transistor M6 is cascode connected with an eighth Nch transistor (for example, Nch transistor M8). A second cascode amplifier circuit composed of the cascode connected Nch transistors M6 and M8 and the load Pch transistors M10 and M29 amplifies an output of the drain electrode of the Nch transistor M4. An output of the second cascode amplifier circuit is applied to a gate electrode of a second Pch transistor (for example, Pch transistor M12) having a source electrode connected with the power supply potential VDD. The Pch transistor M12 further amplifies the output of the cascode amplifier circuit, and outputs the other differential output signal, Vout+, from the drain electrode of the Pch transistor M12. That is, the Pch transistor M12 serves as a second output amplifier circuit.

Signal paths extending through the differential-connected Nch transistors M1 and M4, and the cascode connected Nch transistors (M5, M7) (M6, M8), and Pch transistors M11 and M12 form three-stage amplifier circuits. In these paths, the cascode amplifier at the second stage and source-grounded amplifier at the third stage produce a gain. That is, these paths function as gain paths having high-gain and narrow-band characteristics. Incidentally, capacitors C1 and C2 connected between drain electrodes and gate electrodes of the Pch transistors M11 and M12 are phase compensation capacitors for prevention oscillation due to the high gain of the gain path.

On the other hand, an output of the drain electrode of the Nch transistor M2 as a component of the second differential amplifier circuit is applied to a gate electrode of a tenth Nch transistor (for example, Nch transistors M14) having a source electrode connected with the reference potential GND. The output of the drain electrode that is amplified by the Nch transistors M14 is output as the other differential output signal, Vout+, from the drain electrode of the Nch transistors M14. That is, the Nch transistor M14 functions as a fourth output amplifier circuit.

Likewise, an output of a drain electrode of the Nch transistor M3 is applied to a gate electrode of a ninth Nch transistor (for example, Nch transistor M13) as a component of the second differential amplifier circuit with a source electrode being connected with the reference potential GND. The output of the drain electrode of the Nch transistor M3 that is amplified by the Nch transistor M13 is output as the other differential output signal, Vout−, from the drain electrode of the Nch transistor M13. That is, the Nch transistor M13 functions as a third output amplifier circuit.

Signal paths extending through the differential-connected Nch transistors M2, M3 and Nch transistors M14, M13 form two-stage amplifier circuits where signal amplifying elements can be all composed of Nch transistors. The signal paths function as feedforward paths having a relatively low gain but having wide-band characteristics. The feedforward paths and the above gain paths are arranged based on a parallel path structure. Signals amplified through each path are synthesized at an output terminal. Then, the characteristics of both the paths complement each other and an operational amplifier of this embodiment obtains high-gain and wide-band characteristics.

That is, in this embodiment, resistance value so the resistors R1 to R4 as drain loads of the Nch transistor pairs M1, M4 and M2, M3 constituting the first and second differential amplifier circuits as input circuits for the signal paths of the gain path and feedforward path are set small. Thus, a DC potential drop at an input stage is suppressed to, for example, about 0.1 V, and a requisite power supply voltage can be lowered. Further, at the input stage, wideband characteristics can be attained because of a low gain. Here, in this embodiment, a subsequent amplifier composing the gain path produces a high gain for obtaining a high DC gain. Further, a gain of a high-frequency component is obtained with an amplifier composed of a subsequent Nch transistor constituting the feedforward path, whereby a desired gain and band characteristics can be obtained.

If power supply side terminals of the load resistors R1 to R4 are merely connected with a power supply voltage VDD, bias currents of input transistors M5 and M6 subsequent to the gain path and input transistors M13 and M14 subsequent to the feedforward path varies depending on a power supply voltage. Hence, according as the power supply voltage varies, the bias current values vary. As a result, gain characteristics may vary.

In order to avoid such a situation, in this embodiment, a power supply side node between the load resistors R1 and R4 is connected with a drain electrode of the constant current source transistor M26, and a power supply side node between the load resistors R2 and R3 is connected with a drain electrode of the constant current source transistor M27. The load resistors R1 to R4 are driven with a constant current, whereby a power supply voltage can be reduced without using a non-doped Nch transistor for supplying a stable intermediate potential for the resistive load.

Further, a local negative feedback loop composed of eleventh, twelfth, and thirteenth Nch transistors (for example, Nch transistors M21, M22, and M19) is formed between a drain electrode and a source electrode of Nch transistors M1 and M4 composing the first differential amplifier circuit. A drain-source path of the Nch transistor M19 is connected between the power supply voltage VDD and the common source electrode of the Nch transistors M1 and M4. A current difference between the constant current source transistors M23 and M26 is absorbed as a drain current of the Nch transistor M19. Hence, a value of current flowing through the constant current source transistor M23 is set larger than a value of current flowing through the constant current source transistor M26.

An operation of the local feedback loop is as follows. That is, when a common-mode drain current of the Nch transistors M1 and M4 reduces, for example, a drain voltage of the Nch transistors M1 and M4 is increased. Hence, a common-mode drain current of the Nch transistors M21 and M22 increases, which causes the drain voltage to lower. Therefore, the Nch transistor M19 is changed to reduce a drain current to be absorbed. Along with the change of the Nch transistor M19, a common-mode drain current of the Nch transistors M1 and M4 increases. As a result, a drain voltage of the Nch transistors M1 and M4, that is, a common-mode component of a gate potential of the input transistors M5 and M6 subsequent to the gain path (that is, operating point) is stabilized. When the operating point is stabilized, the bias current of the input transistors M5 and M6 subsequent to the gain path can be accurately determined even at the time of inputting a differential signal.

Further, a drain electrode of the Nch transistors M7 and M8 as output transistors of a cascode amplifier circuit composing a gain path is also connected with a gate electrode of the fourth and fifth Pch transistors (for example, Pch transistor M15 and M16) having a source electrode connected with the power supply potential VDD. The drain electrode of the Pch transistors M15 and M16 is connected with a source electrode of the Nch transistors M7 and M8 as output transistors of the cascode amplifier circuit through a source/drain of the sixth and seventh Pch transistors (for example, Pch transistors M17 and M18) having a gate electrode applied with a constant voltage. Thus, a load feedback loop is formed in the gain path. Further, the drain electrodes of the Pch transistors M15 and M16 composing this local feedback loop are connected to each other.

As a result, differential signals in each local negative feedback loop cancel out each other at drain electrodes of the Pch transistors M15 and M16, so these feedback loops operate as local common-mode negative feedback loops in the gain path. Accordingly, at the time of inputting differential signals, drain potentials of output transistors of the cascode amplifier circuits, Nch transistors M7, M8, that is, common-mode components (operating point) of gate potentials at the Pch transistors M11 and M12 constituting the output amplifier circuit are accurately detected to stabilize the bias current of the output transistors M12 and M11.

On the other hand, a common source electrode of the Nch transistors M2 and M3 constituting the second differential amplifier circuits is connected with a source electrode of a fourteenth Nch transistor (for example, Nch transistors M20) having a gate electrode applied with a DC feedback voltage Vcont from the common-mode feedback circuit (not shown). Incidentally, the common-mode feedback circuit may be configured as disclosed in Japanese Unexamined Patent Application Publication No. 2000-151305, for example. The drain electrode of the Nch transistor M20 is connected with a power supply potential (VDD) to absorb a current difference between the constant current source transistors M24 and M27. Accordingly, as for the constant current source transistors M24 and M27, a value of current flowing through the constant current source transistor M24 is set larger than that of current flowing through the constant current source transistor M27. An operation of the common-mode feedback loop is as follows. That is, if the common-mode output voltage of the operational amplifier circuit is increased, a voltage of a control terminal Vcont is increased to increase a drain current of the Nch transistors M20 under the control. As a result, the common-mode drain current of the feedforward path input differential transistor pair M2, M3 is decreased under the control to increase the drain voltage. Along with the change, the common-mode drain current of the subsequent Nch transistors M14, M13 increases. As a result, negative feedback control is executed such that the drain voltage (that is, the common-mode output voltage) of the Nch transistors M14, M13, whereby the bias current of the subsequent output transistors M13, M14 can be accurately set in a stable manner even at the time of inputting the differential signal.

The DC feedback voltage Vcont applied to the gate electrode of the Nch transistors M20 is supplied from the common-mode feedback circuit for feeding back common-mode components of the output signals (Vout+, Vout−). Due to the DC feedback voltage Vcont, a bias current of Nch transistors M13, M14 at the feedforward path output stage is set equal to a bias current of the Pch transistors M11, M12 at the gain path output stage under the control.

Further, the Nch transistor M20 makes it possible to the common-mode feedback control contact is used as a common source electrode of the feedforward path input differential transistor pair M2, M3. Hence, a potential level of the common-mode feedback control terminal Vcont (gate terminal of the transistor M20) connected with the ground potential GND can be lowered. This contributes to the low-voltage operation.

Transistors of this embodiment are all enhancement-type transistors. Further, the lowest operation voltage of each part of this embodiment is the sum of a saturation voltage (0.25 V) of one transistor for the constant current source transistors M26, M27, a voltage drop (0.1 V) of the resistors R1 to R4, and the voltage VGS (0.6 V) of the Nch transistors M5, M6, M13, and M14 at the gain path/feedforward path input circuit parts, and a voltage value is about 0.95 V (0.25 V+0.1 V+0.6 V) without consideration of variations.

In the amplifier circuit part at the second stage of the gain path, the voltage is the sum of each saturation voltage (0.25 V) of the cascode connected transistors M5, M6 and transistors M7, M8, and the voltage VGS (0.6 V) of the Pch transistors M11, M12, and a voltage value is about 1.1 V (0.6 V+0.25 V×2) without consideration of variations. Further, at the output circuit part, the voltage is the sum of each saturation voltage (0.25 V) of the Pch transistors M11, M12 and the Nch transistors M13, M14, and the output signal amplitude (for example, 0.5 $V_{0-p}$), and a voltage value is about 1.0 V (0.25 V×2+0.5 V) without consideration of variations.

Accordingly, the lowest operation voltage of the circuit is determined to be about 1.1 V in the amplifier circuit part at the second stage of the gain path, so a nominal value is about 1.2 V in consideration of temperature characteristics and variations to enable a low-power-supply-voltage operation. Further, the parallel path structure makes it possible to save power consumption.

As set forth above, according to this embodiment, a low-power-supply voltage operation can be performed since the nominal value is about 1.2 V (about 1.1 V without consideration of variations), and a high-gain and wide-band operational amplifier circuit that consumes a smaller amount of current can be realized. If the circuit of this embodiment is designed with the power supply voltage of 1.2 V, it is possible that VDD equals 1.2 V, a consumed current is 4.4 mA, a DC gain is 96 dB, and a unity gain frequency is 1.3 GHz (load capacitance of 1.8 pF).

It is apparent that the present invention is not limited to the above embodiment that may be modified and changed without departing from the scope and spirit of the invention.

What is claimed is:

1. An operational amplifier circuit, comprising:
a first differential transistor pair including first and second resistors that have a common source electrode connected with a first constant current source transistor, and a common node connected with a second constant current source transistor and serve as drain loads; and
a second differential transistor pair including third and fourth resistors that have a common source electrode connected with a third constant current source transistor, and a common node connected with a fourth constant current source transistor and serve as drain loads,
wherein the first differential transistor pair constitutes a signal input circuit of a gain path, and the second differential transistor pair constitutes a signal input circuit of a feedforward path for feedforward of the gain path to obtain a parallel path structure in which signals amplified through each of the paths are synthesized at an output end.

2. The operational amplifier circuit according to claim 1, wherein the gain path is composed of a plurality of amplifier circuits as a path that is set to have a narrow-band and high-gain characteristic, and the feedforward path is composed of a plurality of amplifier circuits using amplifying elements of an Nch transistor as a path set to have a wide-band and low-gain characteristic.

3. The operational amplifier circuit according to claim 2, wherein the gain path is set to have a narrow-band and high-gain characteristic and composed of three amplifier circuits including:
a first differential amplifier circuit composed of the first differential transistor pair;
a cascode amplifier circuit composed of an input transistor having a source electrode connected with a reference potential and a gate electrode receiving an output of the first differential amplifier circuit, and an output transistor having a source electrode connected with a drain electrode of the input transistor; and
a first output amplifier circuit having a source electrode connected with a power supply potential, a gate electrode receiving an output of the cascode amplifier circuit, and a drain electrode as an output terminal, and
wherein the feedforward path is set to have a wide-band and low-gain characteristic and composed of two amplifier circuits including:
a second differential amplifier circuit composed of the second differential transistor pair; and
a second output amplifier circuit composed of a transistor having a source electrode connected with a reference potential, a gate electrode receiving an output of the second differential amplifier circuit, and a drain electrode as the output terminal.

4. The operational amplifier circuit according to claim 1, wherein the gain path is set to have a narrow-band and high-gain characteristic and composed of three amplifier circuits including:
a first differential amplifier circuit composed of the first differential transistor pair;
a cascode amplifier circuit composed of an input transistor having a source electrode connected with a reference potential and a gate electrode receiving an output of the first differential amplifier circuit, and an output transistor having a source electrode connected with a drain electrode of the input transistor; and
a first output amplifier circuit having a source electrode connected with a power supply potential, a gate electrode receiving an output of the cascode amplifier circuit, and a drain electrode as an output terminal, and
wherein the feedforward path is set to have a wide-band and low-gain characteristic and composed of two amplifier circuits including:
a second differential amplifier circuit composed of the second differential transistor pair; and
a second output amplifier circuit composed of a transistor having a source electrode connected with a reference potential, a gate electrode receiving an output of the second differential amplifier circuit, and a drain electrode as the output terminal.

5. An operational amplifier circuit, comprising:
a first differential amplifier circuit composed of first and second Nch transistors having gate electrodes connected with each differential input terminal, a source electrode commonly connected with a first constant current source Nch transistor, and drain electrodes connected with first and second load resistors, and a first constant current source Pch transistor having a source electrode connected with a power supply potential, and a drain electrode connected with a common node between the first and second load resistors;
a second differential amplifier circuit composed of third and fourth Nch transistors having gate electrodes connected with each of the differential input terminals together with gate electrodes of the first and second Nch transistors, a source electrode commonly connected with a second constant current source Nch transistor, and drain electrodes connected with third and fourth load resistors, and a second constant current source Pch transistor having a source electrode connected with a power supply potential, and a drain electrode connected with a common node between the third and fourth load resistors;

a first cascode amplifier circuit composed of a first cascode amplifier circuit including a fifth Nch transistor having a source electrode connected with a reference potential, and gate electrode connected with a drain electrode of the first Nch transistor, and a sixth Nch transistor having a source electrode connected with a drain electrode of the fifth Nch transistor;

a second cascode amplifier circuit including a seventh Nch transistor having a source electrode connected with a reference potential, and a gate electrode connected with a drain electrode of the second Nch transistor, and an eighth Nch transistor having a source electrode connected with a drain electrode of the seventh Nch transistor;

a first output amplifier circuit including a first Pch transistor having a source electrode connected with a power supply potential, a gate electrode connected with a drain electrode of the sixth Nch transistor, and a drain electrode connected with one differential output terminal;

a second output amplifier circuit including a second Pch transistor having a source electrode connected with a power supply potential, a gate electrode connected with a drain electrode of the eighth Nch transistor, and a drain electrode connected with the other differential output terminal;

a third output amplifier circuit including a ninth Nch transistor having a source electrode connected with a reference potential, a gate electrode connected with a drain electrode of the fourth Nch transistor, and a drain electrode connected with the one differential output terminal; and a fourth output amplifier circuit including a tenth Nch transistor having a source electrode connected with a reference potential, a gate electrode connected with a drain electrode of the third Nch transistor, and a drain electrode connected with the other differential output terminal.

6. The operational amplifier circuit according to claim 5, wherein a current value of the first constant current source Nch transistor is set larger than a current value of the first constant current source Pch transistor, and the operational amplifier circuit further comprises a local feedback loop including:

an eleventh Nch transistor having a source electrode connected with a reference potential, and a gate electrode connected with a drain electrode of the first Nch transistor;

a twelfth Nch transistor having a source electrode connected with a reference potential, a gate electrode connected with a drain electrode of the second Nch transistor, and a drain electrode connected with a drain electrode of the eleventh Nch transistor; and a thirteenth Nch transistor having a drain electrode connected with a power supply potential, a gate electrode connected with drain electrodes of the eleventh and twelfth Nch transistors, and a source electrode connected with source electrodes of the first and second Nch transistors.

7. The operational amplifier circuit according to claim 6, further comprising a local common-mode feedback loop including:

fourth and fifth Pch transistors having source electrodes connected with a power supply potential, and gate electrodes connected with drain electrodes of the sixth and eighth Nch transistors;

sixth and seventh Pch transistors having gate electrodes applied with a constant voltage, source electrodes connected with drain electrodes of the fourth and fifth Pch transistors, and drain electrodes connected with source electrodes of the sixth and eighth Nch transistor, with drain electrodes of the fourth and fifth Pch transistors being connected with each other.

8. The operational amplifier circuit according to claim 7, wherein a current value of the second constant current source Nch transistor is set larger than a current value of the second constant current source Pch transistor, and the operational amplifier circuit further comprises a fourteenth Nch transistor having a drain electrode connected with a power supply potential, a source electrode connected with source electrodes of the third and fourth Nch transistors, and a gate electrode for setting a common-mode output voltage to be output from the differential output terminal.

9. The operational amplifier circuit according to claim 5, further comprising a local feedback loop including: fourth and fifth Pch transistors having source electrodes connected with a power supply potential, and gate electrodes connected with drain electrodes of the sixth and eighth Nch transistors; and sixth and seventh Pch transistors having gate electrodes applied with a constant voltage, source electrodes connected with drain electrodes of the fourth and fifth Pch transistors, and drain electrodes connected with source electrodes of the sixth and eighth Nch transistors with the drain electrodes of the fourth and fifth Pch transistors being connected with each other.

10. The operational amplifier circuit according to claim 9, wherein a current value of the second constant current source Nch transistor is set larger than a current value of the second constant current source Pch transistor, and the operational amplifier circuit further comprises a fourteenth Nch transistor connected with a common-mode feedback circuit having a drain electrode connected with a power supply potential, a source electrode connected with source electrodes of the third and fourth Nch transistors, and gate electrodes for setting a common-mode output voltage to be output from the differential output terminal.

11. The operational amplifier circuit according to claim 5, wherein a current value of the second constant current source Nch transistor is set larger than a current value of the second constant current source Pch transistor, and the operational amplifier circuit further comprises a fourteenth Nch transistor connected with a common-mode feedback circuit having a drain electrode connected with a power supply potential, a source electrode connected with source electrodes of the third and fourth Nch transistors, and gate electrodes for setting a common-mode output voltage to be output from the differential output terminal.

* * * * *